(12) United States Patent
Peng

(10) Patent No.: US 7,890,820 B2
(45) Date of Patent: Feb. 15, 2011

(54) SEMICONDUCTOR TEST SYSTEM WITH SELF-INSPECTION OF MEMORY REPAIR ANALYSIS

(75) Inventor: Chia-Ching Peng, Hsinchu (TW)

(73) Assignee: King Yuan Electronics Co., Ltd., Hsinchu (TW)

( * ) Notice: Subject to any disclaimer, the term of this patent is extended or adjusted under 35 U.S.C. 154(b) by 50 days.

(21) Appl. No.: 12/585,016

(22) Filed: Sep. 1, 2009

(65) Prior Publication Data

US 2010/0211837 A1 Aug. 19, 2010

(30) Foreign Application Priority Data

Feb. 18, 2009 (TW) .............................. 98105116 A

(51) Int. Cl.
*G11C 29/00* (2006.01)
(52) U.S. Cl. ...................................... 714/710; 714/718
(58) Field of Classification Search ...................... 714/4, 714/6, 719, 723, 710, 718
See application file for complete search history.

(56) References Cited

U.S. PATENT DOCUMENTS

| | | | |
|---|---|---|---|
| 5,841,783 A * | 11/1998 | Suzuki et al. ............... | 714/704 |
| 6,374,378 B1 * | 4/2002 | Takano et al. ............... | 714/719 |
| 7,188,274 B2 * | 3/2007 | Nadeau-Dostie et al. ....... | 714/6 |
| 7,613,960 B2 * | 11/2009 | Okawa et al. ............... | 714/710 |
| 2003/0101388 A1 * | 5/2003 | Tseng et al. ................ | 714/710 |

* cited by examiner

*Primary Examiner*—David Ton
(74) *Attorney, Agent, or Firm*—Bacon & Thomas, PLLC

(57) ABSTRACT

A semiconductor test system with self-inspection of memory repair analysis is disclosed, comprising a memory repair analysis device, an analysis fail memory and a self-inspection controller. The self-inspection controller controls storing a set of simulated fail bit addresses and a set of simulated repair line addresses, provided from outside, into the analysis fail memory in advance, controls the memory repair analysis device to execute a particular repair analysis operation with respect to the set of simulated fail bit addresses to produce repair line address information, and compares the repair line address information, obtained after calculation, directly with the set of simulated repair line addresses in the analysis fail memory. Thus, before physically proceeding with the operation of testing, the invention is capable of self-inspecting if there is an abnormal condition of the memory repair analysis device and the analysis fail memory contained therein.

6 Claims, 5 Drawing Sheets

SEMICONDUCTOR TEST SYSTEM WITH SELF-INSPECTION OF MEMORY REPAIR ANALYSIS

BACKGROUND OF THE INVENTION

1. Field of the Invention

The present invention relates to a semiconductor test system and, more particularly, to a semiconductor test system for inspecting a memory IC chip and with self-inspection of a memory repair analysis module.

2. Description of Related Art

Accompanied by continuous development of techniques, various kinds of memories and memory capacity have been developed, such as DRAM, SRAM, flash memory, DDR DRAM (Double Data Rate DRAM), and SOC. The memory capacity is increased in a multiple manner. The conventional DRAM with 4 Mb or 16 Mb has been extended to DDR or RAM with GB.

As such, when the capacity of the memory is getting bigger and bigger, the probability of generating a failure memory cell (or called memory bit) during fabrication of the semiconductor is inevitably getting higher and higher and the rate of the production yield is reduced due to increase of the quantity of the damaged memories. Therefore, the test of the memory plays an important role, in which the test bench (machine) or equipment dominates an absolutely important part. If the test bench or equipment is in failure or out of order, big loss in cost will be incurred. In addition, in many occasions of incurring failure or an abnormal condition, the bench or equipment itself will not inform or notify the situation automatically and it is hard to trace back when the failure or abnormal condition starts, which quite often results in a serious event of withdrawing. Not only loss of cost is incurred, but also reputation of the company will be affected.

However, since the memory provides a memory zone with columns and rows required normally and at the meantime is reserved with a redundancy circuit (or called "redundancy cell"), the technique of laser fuse is mainly used to alter the circuit path so as to replace a damaged memory cell in a normal zone, thereby achieving the objective of raising yield. Thus, an important step before proceeding with the laser fuse is using the technique of memory repair analysis (MRA). That is, a memory bit position with failure after the test is calculated, analyzed and judged if it may be repaired. If repair can be made, it has to decide how to replace useful information for repairing so as to proceed with the subsequent repairing procedures. Thus, a memory repair analysis device occupies a rather important and indispensable part in the whole memory test process.

Although each of the global enterprises in semiconductor test equipments possesses its own techniques of self-inspection for the test bench, the techniques are directed to inspecting the whole equipment, including inspections one by one on each part of the bench and each of the sub-systems. Such inspections waste more time and cost. As far as the existing techniques are concerned, there is no provision of a system or method capable of rapid and effective inspections and fit for use in a memory repair analysis apparatus for all kinds of memory test equipments produced by the enterprises.

Therefore, it is desirable to provide an improved semiconductor test system for inspecting a memory IC chip and with self-inspection of a memory repair analysis device to mitigate and/or obviate the aforementioned problems.

SUMMARY OF THE INVENTION

The object of the present invention is to provide a semiconductor test system with self-inspection of memory repair analysis, comprising a memory repair analysis device, an analysis fail memory and a self-inspection controller. The memory repair analysis device is used for executing a particular repair analysis operation to produce repair line address information. That is, in the memory repair analysis device, a memory bit position with failure, obtained after test, is calculated, analyzed and judged if it may be repaired. If repair can be made, it has to decide how to replace useful information for repairing so as to proceed with the subsequent repairing procedures.

In addition, the analysis fail memory includes a fail address memory for storing fail bit address information, and a repair address memory. When in normal proceeding with test of the memory, the analysis fail memory is mainly for use in storing the test result regarding if all bits of the memory under test are good or not. In other words, when proceeding with test of the memory routinely, the analysis fail memory stores the fail bit address information of the memory under test after testing, which information is based for the memory repair analysis device to judge if repairing may be made and how to proceed with repairing.

Further, the self-inspection controller is respectively electrically connected to the memory repair analysis device and the analysis fail memory, wherein the self-inspection controller controls storing a set of simulated fail bit addresses, provided from outside, into the fail address memory, controls storing a set of simulated repair line addresses, provided from outside, into the repair address memory, in which a simulated repair line address refers to a particular correct one correspondingly generated after the memory repair analysis device executes the above-said particular repair analysis operation with respect to the set of simulated fail bit addresses, further controls the memory repair analysis device to execute the above-said particular repair analysis operation with respect to the set of simulated fail bit addresses in the fail address memory and to produce the repair line address information, and compares the calculated repair line address information with the set of simulated repair line addresses in the repair address memory of the analysis fail memory. Thus, before proceeding with the operation of testing a memory chip under test, the invention is capable of self-inspecting if there is an abnormal condition of each of the memory repair analysis device and the analysis fail memory.

Further, as the self-inspection controller compares the repair line address information with the set of simulated repair line addresses in the analysis fail memory and finds not matching, it outputs a corresponding alarm signal. Of course, if it is in a matching condition after comparison, a normal signal may be outputted. The alarm signal may be one of voice, light or electronics, and may be a flag resulting from comparison. According to the invention, the set of simulated repair line addresses includes eight row fail addresses and two column fail addresses. However, due to the use of a different machine or equipment, the different specification of the memory under test, or other particular requirements, the quantities of row fail addresses and column fail addresses of the set of simulated repair line addresses may be altered.

Preferably, the invention may further comprise a central server, being electrically connected to the self-inspection controller via a network, wherein the set of simulated fail bit addresses and the set of simulated repair line addresses are supplied to the self-inspection controller through the central server. Based on this, the invention may be extended to that the central server proceeds with managing and recording for a plurality of machines. Still further, the invention further comprises a memory module, being electrically connected to the self-inspection controller, wherein the self-inspection controller stores the set of simulated fail bit addresses and the set of simulated repair line addresses, obtained from the network, into the memory module. In addition, the memory module may provide storing of the comparison result.

Meanwhile, the memory repair analysis device includes a fail buffer memory, a fail count unit and a control unit. The control unit is to control accessing and operating of the fail buffer memory and the fail count unit. The fail buffer memory is to temporarily store the set of simulated fail bit addresses obtained from the analysis fail memory. In addition, when executing test of the memory routinely, it is used to temporarily store the fail bit address information. On the other hand, the fail count unit is to proceed with calculation and analysis as to if repair can be made. If yes, it proceeds with how to replace and repair. The self-inspection controller first stores the set of simulated fail bit addresses into the fail buffer memory, and then the control unit controls the fail counter unit to proceed with the above-said particular repair analysis operation with respect to the set of simulated fail bit addresses in the fail buffer memory.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
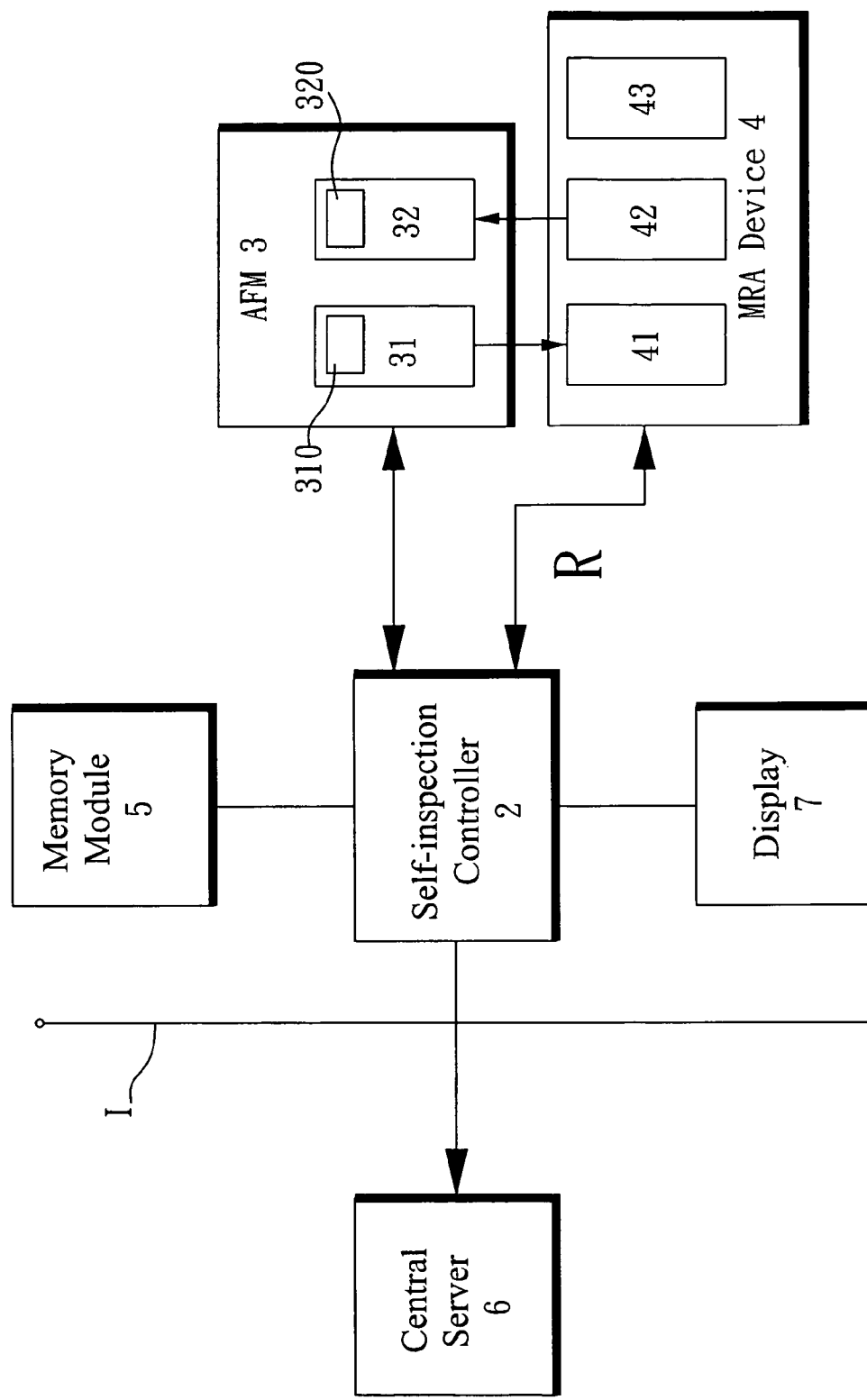
FIG. 1 is a system structure diagram according to a preferred embodiment of the invention.

With reference to FIG. 1, there is shown a system structure diagram of a semiconductor test system with self-inspection of memory repair analysis according to a preferred embodiment of the invention. As shown, an analysis fail memory 3 (hereinafter abbreviated as AFM) includes a fail address memory 31 for storing fail bit address information correspondingly provided in a memory chip, and a repair address memory 32. That is, when the semiconductor test system is proceeding with routine test of the memory, the test result regarding if all bits of the memory chip under test (not shown in the drawing) are good or not will be stored in the fail address memory 31 of the AFM 3. In other words, the AFM 3 is used to store the related information on the number of the fail units or of the fail blocks in the memory under test after testing, which information is based to judge if repair proceeding may be made for the memory under test.

In addition, the drawing shows a memory repair analysis device 4 (hereinafter abbreviated as MRA device), which is used for executing a particular repair analysis operation to produce repair line address information R. That is, the address information of a fail bit, obtained after test of a memory, is calculated, analyzed and judged if it may be repaired. If repairing can be made, it has to decide how to replace useful information for repairing so as to proceed with the subsequent repairing procedures.

The MRA device 4 includes a fail buffer memory 41, a fail count unit 42 and a control unit 43. The control unit 43 is to control accessing, calculating and comparing of the fail buffer memory 41 and the fail count unit 42. The fail buffer memory 41 is to temporarily store the related information in the fail address memory 31 or the repair address memory 32, obtained from the AFM, or to temporarily store the related information of the fail memory after testing, such as the address information of the fail bit when the test equipment routinely proceeds with test of the memory. On the other hand, the fail count unit 42 is to proceed with calculation and analysis as to if repairing can be made. If yes, it proceeds with how to replace and repair.

Further, the drawing shows a self-inspection controller 2, being respectively electrically connected to the AFM 3 and the MRA device 4. In addition, the embodiment comprises a central server 6, being electrically connected to the self-inspection controller 2 via a network I. The central server 6 is stored with test programs corresponding to a plurality of test machines with different specifications and provides recording and managing of test result. When proceeding with self-inspection of repair analysis for the memory, it is merely necessary to send an input instruction (such as advan_mra_diag) under any catalog or particular catalog in the semiconductor test system, and the self-inspection controller 2 will automatically downloads a test program from the central server 6 to the particular catalog (such as /export/home/asx/diag/td_mra_check) in the semiconductor test system, automatically execute the corresponding program according to the different specification of a semiconductor test system, and at the meantime store the test result in a memory module 5 and the central server 6 of the internal part of the test machine to facilitate monitoring and managing.

The memory module 5 is electrically connected to the self-inspection controller 2. As the central server 6 downloads the program and stores it in the memory module 5 and after the self-inspection controller 2 concurrently activates to execute, a set of simulated fail bit addresses 310 and a set of simulated repair line addresses 320 are produced and supplied to the self-inspection controller 2. In the embodiment, it is first to code and program into an electronic file, which is received by the self-inspection controller 2 to execute decoding so as to respectively obtain the above-said set of simulated fail bit addresses 310 and the set of simulated repair line addresses 320. Of course, other approaches may be adopted. For example, the central server 6 downloads a compressed electronic file, which is received by the self-inspection controller 2 to execute decompressing. Or, it may download with a different file directly.

Subsequently, the self-inspection controller 2 controls storing the set of simulated fail bit addresses 310 into the fail address memory 31 of the AFM 3, in which the set of simulated fail bit addresses 310 refers to related information of a memory after test through simulation and includes a plurality of simulated fail bit addresses 310. On the other hand, the self-inspection controller 2 controls storing the set of simulated repair line addresses 320 into the repair address memory 32 of the AFM 3, in which a simulated repair line address 320 refers to a particular correct one correspondingly generated after the MRA device 4 executes the particular repair analysis operation with respect to the set of simulated fail bit addresses 310. That is, in a normal condition, as the MRA device 4 does not have any abnormal situation, through analysis and calculation of the MRA device 4, the set of simulated fail bit addresses 310 will be coincident with the set of simulated repair line address 320 in result.

Among which, the above-said particular repair analysis operation refers to a rule pre-set in the MRA device 4, which rule may be determined according to the related factors, such as the specification of the product, limitation of the process or machine, customer's requirements, and the standard of the yield, etc. Then, the self-inspection controller 2 controls storing the set of simulated fail bit addresses 310 into the fail buffer memory 41 of the MRA device 4. Further, the self-inspection controller 2 controls the control unit 43 of the MRA device 4 to control the fail count unit 42 to proceed with the above-said particular repair analysis operation with respect to the set of simulated fail bit addresses 310 in the fail buffer memory 41 and to produce the repair line address information R. Then, the self-inspection controller 2 compares the repair line address information R with the set of simulated repair line addresses 320 in the repair address memory 32 of the AFM 3. If not matching after comparison, a display 7 outputs a corresponding alarm signal. Of course, if it is in a matching condition after comparison, a normal signal may be outputted. The alarm signal may be one of voice, light or electronics, and may be a flag resulting from comparison.

Figure 2A:
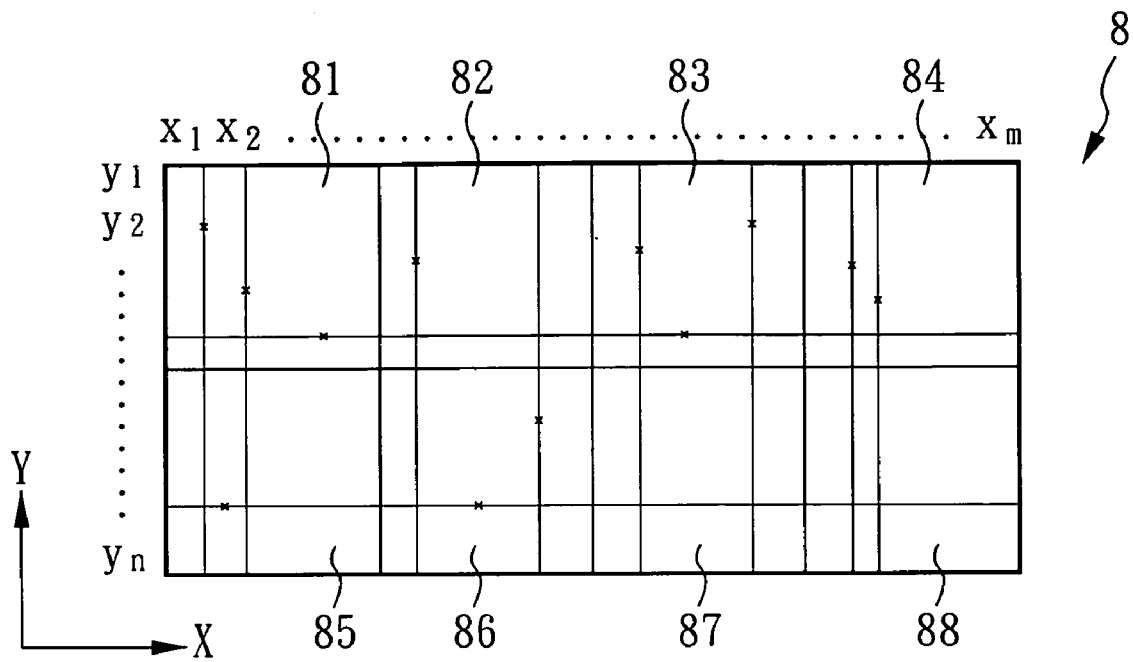
FIG. 2A is a schematic diagram showing a memory bit information block and repair lines according to a preferred embodiment of the invention.
Figure 2B:
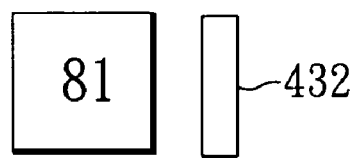
FIG. 2B is a schematic diagram showing a fail count unit according to a preferred embodiment of the invention.
Figure 2B:
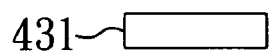

Please refer to FIG. 2A and FIG. 2B. FIG. 2A is a schematic diagram showing a memory bit information block and repair lines of a semiconductor test system with self-inspection of memory repair analysis according to a preferred embodiment of the invention. FIG. 2B is a schematic diagram showing a fail count unit according to a preferred embodiment of the invention. A general and commonly seen semiconductor test system for a memory chip will concurrently provides a number of devices under test (hereinafter abbreviated as DUT, not shown in the drawings). Each DUT may proceed with test of a memory chip. In this embodiment, each memory chip under test will be divided into eight blocks 81,82,83,84,85,86,87,88, including four blocks in the X-axis direction and two blocks in the Y-axis direction, as the fail count unit 42 of the MRA device 4 is operating.

In this embodiment, the set of simulated fail bit addresses 310 includes eight fail bits in the X-axis direction and four fail bits in the Y-axis direction. Under the situation that the MRA device 4 is not in an abnormal condition, each memory chip is analyzed into eight row fail addresses and two column fail addresses, i.e. into eight vertical repair lines and two horizontal repair lines, also being a memory bit block 8 as shown in FIG. 2A. However, as shown in FIG. 2B, taking a block 81 as an example, it includes a vertical analysis storage element 431 and a horizontal analysis storage element 432. The analyzed row fail addresses are temporarily stored in the vertical analysis storage element 431 and the analyzed column fail addresses are temporarily stored in the horizontal analysis storage element 432. After completion of analyzing entirely, the analyzed addresses are compared with the set of simulated repair line addresses 320.

Figure 3:
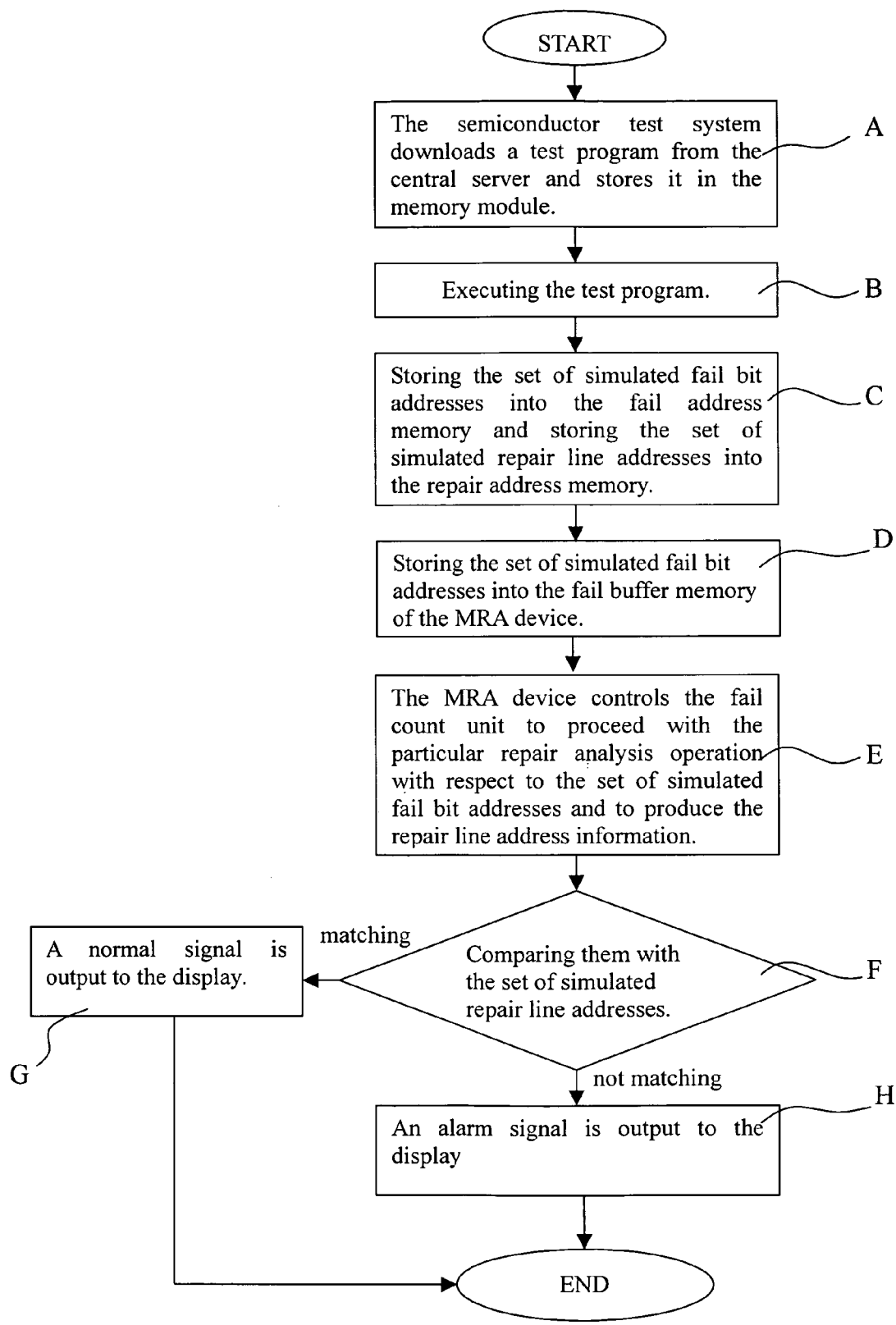
FIG. 3 is a flow chart according to a first preferred embodiment of the invention.

Please refer to FIG. 3. FIG. 3 is a flow chart for a semiconductor test system with self-inspection of memory repair analysis according to a first preferred embodiment of the invention. First, the semiconductor test system downloads a test program from the central server 6 and stores it in the memory module 5 (step A). The self-inspection controller 2 then automatically executes the test program (step B). After execution, the self-inspection controller 2 controls storing the set of simulated fail bit addresses 310 into the fail address memory 31 and storing the set of simulated repair line addresses 320 into the repair address memory 32 (step C). Subsequently, the self-inspection controller 2 controls storing the set of simulated fail bit addresses 310 into the fail buffer memory 41 of the MRA device 4 (step D). Further, the control unit 43 of the MRA device 4 controls the fail count unit 42 to proceed with the above-said particular repair analysis operation with respect to the set of simulated fail bit addresses 310 in the fail buffer memory 41 and to produce the repair line address information R (step E). Thereafter, the self-inspection controller 2 compares the repair line address information R with the set of simulated repair line addresses 320 in the repair address memory 32 of the AFM 3 (step F). If comparison shows matching, a normal signal is output to the display (step G). If comparison shows not matching, an alarm signal is output to the display (step H).

Figure 4A:
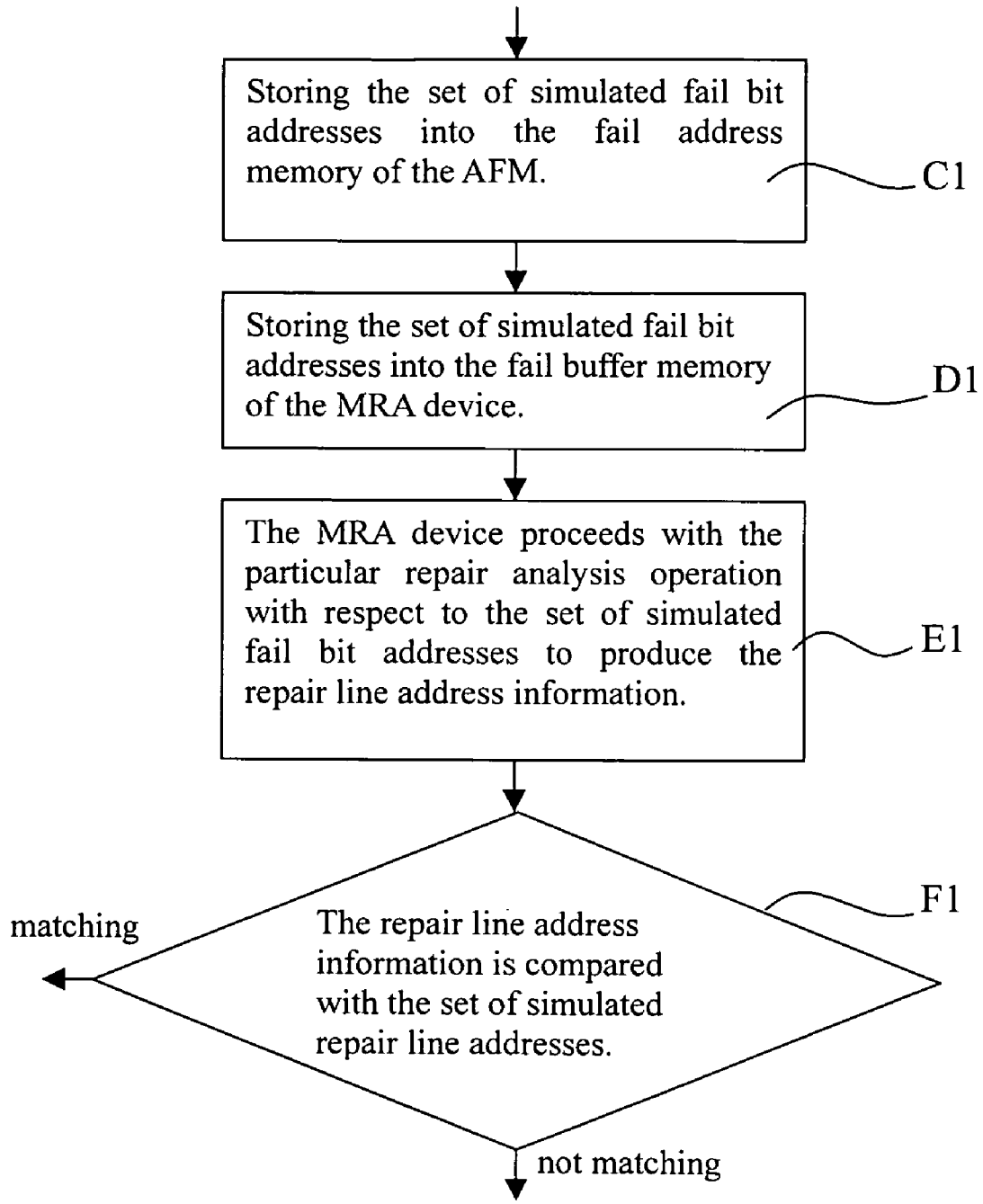
FIG. 4A is a flow chart according to a second preferred embodiment of the invention.

Please refer to FIG. 4A. FIG. 4A is a flow chart according to a second preferred embodiment of the invention. The difference between the second preferred embodiment and the first preferred embodiment mainly lies in that the self-inspection controller 2 merely controls storing the set of simulated fail bit addresses 310 into the fail address memory 31 of the AFM 3, while the set of simulated repair line addresses 320 is still stored in the memory module 5. When proceeding with comparison, the self-inspection controller 2 compares the generated repair line address information R with the set of simulated repair line addresses 320 in the repair address memory 32 stored in the memory module 5.

The flow of the second preferred embodiment is as follows. The self-inspection controller 2 controls storing the set of simulated fail bit addresses 310 into the fail address memory 31 of the AFM 3 (step C1). Subsequently, the self-inspection controller 2 controls storing the set of simulated fail bit addresses 310 into the fail buffer memory 41 of the MRA device 4 (step D1). Further, the MRA device 4 proceeds with the above-said particular repair analysis operation with respect to the set of simulated fail bit addresses 310 to produce the repair line address information R (step E1). And then, the repair line address information R is compared with the set of simulated repair line addresses 320 in the memory module 5 (step F1).

Figure 4B:
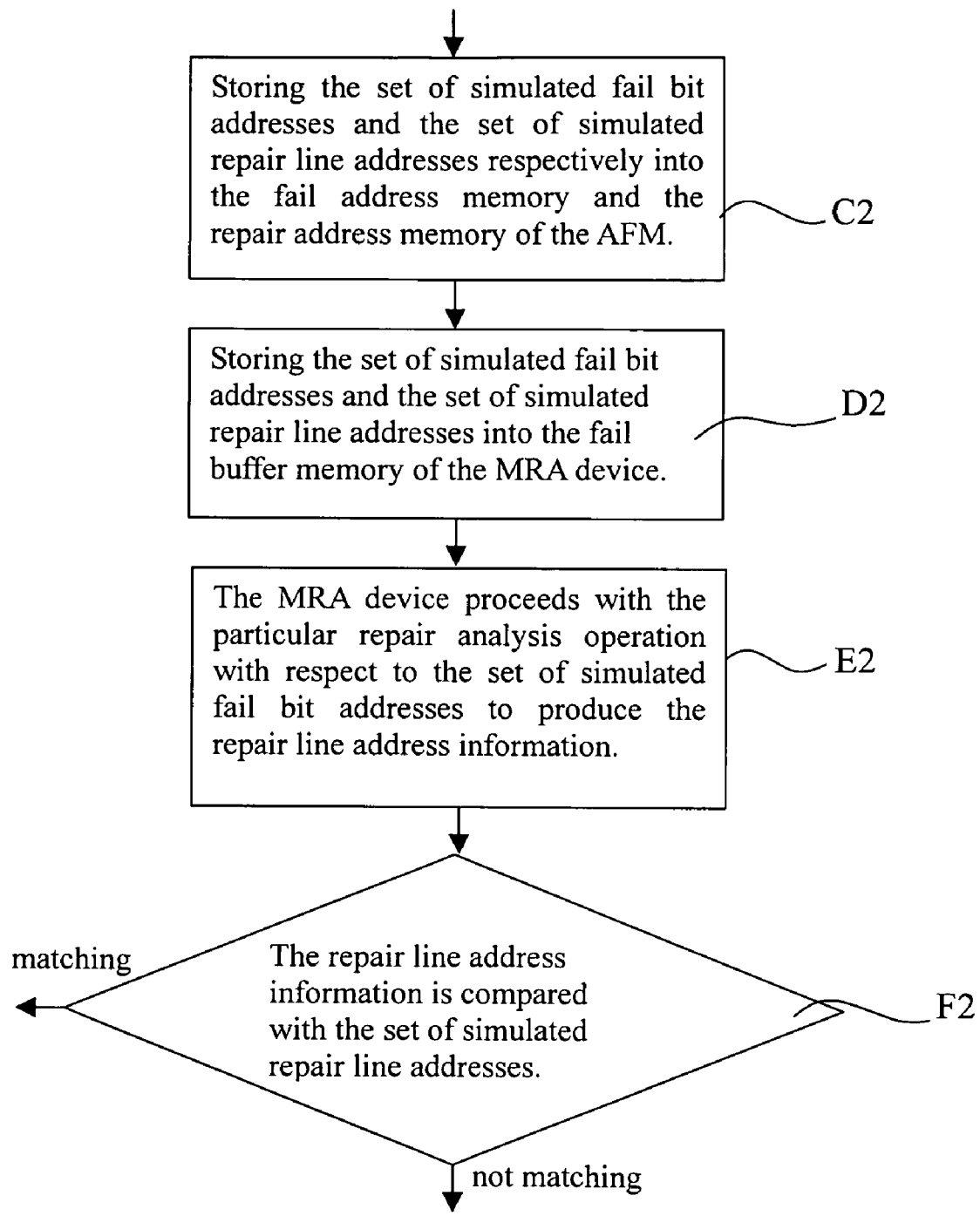
FIG. 4B is a flow chart according to a third preferred embodiment of the invention.

Please refer to FIG. 4B. FIG. 4B is a flow chart according to a third preferred embodiment of the invention. The difference between the third preferred embodiment and the above-said preferred embodiments mainly lies in that the set of simulated fail bit addresses 310 and the set of simulated repair line addresses 320 are both stored in the MRA device 4 directly. After analysis operation, the MRA device 4 proceeds with comparison therein directly.

The flow of the third preferred embodiment is as follows. The self-inspection controller 2 controls storing the set of simulated fail bit addresses 310 and the set of simulated repair line addresses 320 respectively into the fail address memory 31 and the repair address memory 32 of the AFM 3 (step C2). Subsequently, the self-inspection controller 2 controls storing the set of simulated fail bit addresses 310 and the set of simulated repair line addresses 320 into the fail buffer memory 41 of the MRA device 4 (step D2). And then, the MRA device 4 proceeds with the particular repair analysis operation with respect to the set of simulated fail bit addresses 310 to produce the repair line address information R (step E2). Later, the repair line address information R generated after analysis operation is compared directly with the set of simulated repair line addresses 320 in the fail buffer memory 41 (step F2).

Although the present invention has been explained in relation to its preferred embodiment, it is to be understood that many other possible modifications and variations can be made without departing from the scope of the invention as hereinafter claimed.

What is claimed is:

1. A semiconductor test system with self-inspection of memory repair analysis, comprising:
   a memory repair analysis device, for executing a particular repair analysis operation to produce repair line address information;
   an analysis fail memory, including a fail address memory for storing fail bit address information, and a repair address memory; and
   a self-inspection controller, respectively electrically connected to the memory repair analysis device and the analysis fail memory, wherein the self-inspection controller controls storing a set of simulated fail bit addresses into the fail address memory, controls storing a set of simulated repair line addresses into the repair address memory, in which a simulated repair line address refers to a particular correct one correspondingly generated after the memory repair analysis device executes the above-said particular repair analysis operation with respect to the set of simulated fail bit addresses, further controls the memory repair analysis device to execute the above-said particular repair analysis operation with respect to the set of simulated fail bit addresses in the fail address memory and to produce the repair line address information, and compares the repair line address information with the set of simulated repair line addresses in the repair address memory.

2. The semiconductor test system with self-inspection of memory repair analysis as claimed in claim 1, wherein as the self-inspection controller compares the repair line address information with the set of simulated repair line addresses in the analysis fail memory and finds not matching, it outputs a corresponding alarm signal.

3. The semiconductor test system with self-inspection of memory repair analysis as claimed in claim 1, further comprising a central server, being electrically connected to the self-inspection controller via a network, wherein the set of simulated fail bit addresses and the set of simulated repair line addresses are supplied to the self-inspection controller through the central server.

4. The semiconductor test system with self-inspection of memory repair analysis as claimed in claim 1, further comprising a memory module, being electrically connected to the self-inspection controller, wherein the self-inspection controller stores the set of simulated fail bit addresses and the set of simulated repair line addresses, obtained from a network, into the memory module.

5. The semiconductor test system with self-inspection of memory repair analysis as claimed in claim 1, wherein the memory repair analysis device includes a fail buffer memory, a fail count unit and a control unit, and wherein the self-inspection controller stores the set of simulated fail bit addresses into the fail buffer memory, the control unit controls the fail counter unit to proceed with the above-said particular repair analysis operation with respect to the set of simulated fail bit addresses in the fail buffer memory.

6. The semiconductor test system with self-inspection of memory repair analysis as claimed in claim 1, wherein the set of simulated repair line addresses includes eight row fail addresses and two column fail addresses.

* * * * *